United States Patent [19]
Kleinhans et al.

[11] Patent Number: 5,888,638
[45] Date of Patent: Mar. 30, 1999

[54] SEALING ELEMENT, PARTICULARLY FOR SHUT-OFF AND REGULATING VALVES, AND PROCESS FOR ITS PRODUCTION

[75] Inventors: Werner Kleinhans, Unna; Veit Bechte, Holzwickede; Friedrich Wagner, Endingen, all of Germany

[73] Assignee: Friedrich Grohe AG, Hemer, Germany

[21] Appl. No.: 836,824

[22] PCT Filed: Nov. 17, 1995

[86] PCT No.: PCT/EP95/04534

§ 371 Date: May 20, 1997

§ 102(e) Date: May 20, 1997

[87] PCT Pub. No.: WO96/16200

PCT Pub. Date: May 30, 1996

[30] Foreign Application Priority Data

Nov. 21, 1994 [DE] Germany ............. 44 41 134.0

[51] Int. Cl.[6] ...................................................... B32B 9/00
[52] U.S. Cl. ................. 428/217; 428/212; 428/213; 428/214; 428/361; 428/367; 428/375; 428/380; 251/368; 219/121.37; 219/121.54; 204/248.31; 118/719
[58] Field of Search ..................... 428/212, 195, 428/214, 213, 217, 391, 380, 379, 375, 367, 361; 118/719; 204/298.31; 219/121.54, 121.37; 251/368; 137/625.41

[56] References Cited

U.S. PATENT DOCUMENTS 4,856,785  8/1989  Knapp ........................ 251/368
4,991,822  2/1991  Enke .......................... 251/368

Primary Examiner—William Krynski
Assistant Examiner—Abraham Bahta
Attorney, Agent, or Firm—Kanesaka & Takeuchi

[57] ABSTRACT

A sealing element is made up of a shut-off body with a sealing surface; a bonding layer component provided on the sealing surface of the shut-off body and containing silicon and carbon; and a sliding layer component provided on the bonding layer component and containing silicon and carbon. The bonding layer component has a silicon content greater than that of the sliding layer component so that the bonding layer component has more ductile properties than the sliding layer component. The sliding layer component is harder than the bonding layer component. The sliding layer component is thinner than the bonding layer component and less than one um so that the bonding layer component takes up stresses of the sliding layer component without impairing adhesion capability of the bonding layer component to the sealing surface.

10 Claims, No Drawings

SEALING ELEMENT, PARTICULARLY FOR SHUT-OFF AND REGULATING VALVES, AND PROCESS FOR ITS PRODUCTION

BACKGROUND OF THE INVENTION

The invention relates to a sealing element, particularly for shut-off and regulating valves. It comprises a disc-shaped, piston-shaped or spherical shut-off body. The shut-off body can comprise a metallic or nonmetallic material. This material can be, for example, a ceramic material, including aluminium oxide and the various silicon carbides SiC, $Si_2C$ and silicon nitride $Si_3N_4$.

On a working surface (sealing surface) of the shut-off body, a hard material layer containing carbon and silicon is applied by plasma CVD or plasma polymerization in a coating chamber. The hard material layer here comprises a bonding layer component applied to the working surface of the shut-off body and a subsequent covering layer (sliding layer) component. The bonding layer component has a first silicon content favouring adhesion to the working surface of the shut-off body, and the subsequent carbon-containing covering layer component has a second silicon content lower than that of the bonding layer component, or is silicon-free, to achieve low coefficients of sliding friction and static friction.

The deposition from the plasma is carried out by ion bombardment, e.g. by means of a glow discharge or by means of an additional ion gun. From a hydro-carbon-containing atmosphere a wear-resistant, carbon-containing layer having sufficiently low coefficients of sliding friction and static friction can be deposited in this way.

A sealing element of the above type and the associated plasma CVD coating process is known from DE-A 38 32 692.

According to this document, shut-off bodies are, to coat their working surfaces, placed in the coating chamber on a specimen holder having a negative potential relative to the plasma. For initial physical etching of the working surfaces of the shut-off bodies with argon, the coating unit is first operated as cathode atomization (sputtering) unit. For subsequent deposition of the bonding layer component of the hard material layer on the etched working surface, the same unit is then operated under certain first process parameters as high-frequency plasma CVD unit, with the argon gas in the coating chamber being replaced, for example by tetramethylsilane. Under altered second process parameters, the covering or sliding layer component is then deposited from a gas mixture of tetramethylsilane and hexane after deposition of the bonding layer component.

The sealing elements obtained by this method (these can advantageously be coated ceramic plates for water valves, e.g. single-hand mixers) have, thanks to the hard material layer applied, sufficiently low coefficients of sliding friction and static friction when sliding over one another, even in the presence of water, so that greasing of the sealing surfaces as has hitherto been required for uncoated ceramic plates is no longer necessary.

A disadvantage of the known sealing plates is that their hot-water resistance is in many cases unsatisfactory. This is the case particularly when a hot-water resistance of more than 1000 operating hours is to be achieved without the hard material layer applied becoming detached from the shut-off body.

SUMMARY OF THE INVENTION

It is an object of the invention to provide a sealing plate of the type mentioned in the introduction which has both sufficiently low coefficients of static friction and sliding friction on the sliding layer surface and a high hot-water resistance. Preferred sealing plates, in particular in the form of discs, should have a hot-water resistance at 95° C. over an operating period of at least 1000 hours without, in particular, the adhesion of the hard material layer to the shut-off body being significantly impaired.

It was surprising that an optimized thickness ratio of bonding and sliding layer components by selection of the deposition times in the coating chamber was able to improve significantly the adhesion properties of the bonding layer component to the shut-off body under hot water conditions and that, in addition, these adhesion properties of the bonding layer component can be still further improved if the sealing element having an optimized bonding/sliding layer ratio is additionally heat treated, with temperatures of about 5000° C. for from 30 to 60 min and temperatures of about 900° C. for from 0.5 to 1 min having led to particularly good results.

It has been found to be particularly advantageous to make the sliding layer component essentially thin. The residual stresses of the relatively thin sliding layer component can be readily taken up by a sufficiently thick bonding layer component without appreciable demands being made on the adhesion capability of the bonding layer component to the shut-off body, even under long-term hot-water stressing. According to the invention, good results can be obtained if the thickness ratio in $\mu$m of bonding layer component and sliding layer component is from 1:0.9 to 1:0.4, preferably 1:0.6.

The optimum bonding/sliding layer ratio can also be concomitantly influenced by the selection of the gases from which the bonding and sliding layer components are deposited. Thus, it can be advantageous to select tetramethylsilane for depositing the bonding layer component and to select a gas mixture of tetramethylsilane and hexane for depositing the sliding layer component, with the mixing ratio of tetramethylsilane to hexane being in the range from 1:1.5 to 1:5, preferably 1:2. It is clear that tetramethylsilane and hexane can be replaced by comparable gases.

To enable the bonding layer component to take up the residual stresses of the relatively hard and brittle sliding layer component, the former has increased plastic or ductile properties in comparison with the sliding layer component. These stretchable, deformable properties are achieved during deposition of the bonding layer component by the ratio of silicon/carbon/hydrogen being selected so as to be significantly different from the corresponding ratio in the sliding layer component. Thus, the silicon content of the bonding layer component is selected so as to be significantly higher than that of the sliding layer component and, correspondingly, the carbon content of the bonding layer component is selected so as to be significantly lower than that of the sliding layer component, so as to be able to ensure sufficient ductility at a certain thickness of the bonding layer component.

The process of deposition of the bonding layer component and the subsequent sliding layer component is advantageously carried out in such a way as to give a smooth transition from bonding layer component to sliding layer component, with the different silicon/carbon/hydrogen contents of the bonding and sliding layer components being matched to one another in stages or continuously.

DESCRIPTION OF PREFEREED EMBODIMENT

The invention is described below by means of an illustrative embodiment, without being restricted in any way.

Coating is carried out using a coating chamber which corresponds essentially to the coating chamber as already disclosed in DE-A 38 32 692.

The known coating chamber consists in principle of an electrically conductive chamber floor to which is connected a likewise electrically conductive chamber housing closed on all sides. The chamber floor has an insulated connection for a lead-through which provides an electrical connection between the cathode serving as cathodic support and an electrical supply in the form of a high-frequency apparatus. The shut-off bodies are placed on the cathodic support with the surface to be coated facing upwards. In the present case, the shut-off bodies are, without restriction, $Al_2O_3$ ceramic plates for hydraulic valves.

The chamber floor additionally has a second connection for a suction pipe which is connected to a vacuum pump unit. Finally, the chamber floor has connections for feeding process gases into the coating chamber.

The vacuum unit is first switched on and a pressure of about $8\times10^{-5}$ mbar (=0.08μbar) is set in the coating chamber. Subsequently, argon is passed into the coating chamber via a gas feed tube until a gas pressure of about 6 μbar has been reached. The high-frequency apparatus is then switched on and the glow discharge is ignited. A cathode DC potential of about 600 V is set. The coating chamber here operates first as cathode atomization (sputtering) unit in which the cathodic support and the ceramic plates lying thereon are physically etched by ion bombardment for from about 15 to 25 min, preferably 20 min.

The inflow of argon into the chamber is throttled back in stages somewhat before the end of the etching period and at the same time tetramethylsilane (TMS) is fed into the chamber, the feed being increased in stages, so as thereby to obtain as gentle as possible a transition to the bonding layer component of the hard material layer.

At a reduced cathode potential of about 500 V, the bonding layer component is applied for from about 25 to 30 min until a thickness of about 1μm is reached. The sliding layer component is subsequently deposited on the bonding layer component, using a gas mixture of tetramethylsilane and hexane in a ratio of from 1:1.5 to 1:5, preferably 1:2. To obtain a gentle transition from bonding layer component to sliding layer component, the TMS feed is throttled back in stages during a transition time and correspondingly the feed of hexane is increased in stages until the selected TMS/hexane mixture is reached.

The coating time for the sliding layer component is from about 10 to 15 min, so as thereby to obtain a layer thickness of from about 0.4 to 0.9 μm, preferably 0.6 μm.

A thickness ratio of bonding layer component to sliding layer component of 1 μm to 0.6 μm is sufficient for the increased residual stresses of the sliding layer component to be readily taken up by the bonding layer component without the adhesion capability of the bonding layer section on the working surface of the ceramic body being impaired.

The good adhesion conditions of the bonding layer component can be improved still more by the coated ceramic bodies being subjected to a further heat treatment. Particularly good results are achieved if the coated ceramic bodies are heat treated for from 30 to 60 min at about 500° C. or from 0.5 to 1 min at about 9000° C.

We claim:

1. A sealing element, comprising:

a shut-off body with a sealing surface;

a bonding layer component provided on said sealing surface of said shut-off body and containing silicon and carbon; and a sliding layer component provided on said bonding layer component and containing silicon and carbon;

said bonding layer component having a silicon content greater than that of said sliding layer component so that said bonding layer component has more ductile properties than said sliding layer component;

said sliding layer component being harder than said bonding layer component; and said sliding layer component being thinner than said bonding layer component and less than one um so that said bonding layer component takes up stresses of said sliding layer component without impairing adhesion capability of said bonding layer component to said sealing surface.

2. A sealing element according to claim 1, wherein said sealing surface of said shut-off body is part of a ceramic body.

3. A sealing element according to claim 1, wherein a thickness ratio of said bonding layer component to said sliding layer component is about 1:0.9 to 1:0.4.

4. A sealing element according to claim 3, wherein said thickness ratio is about 1:0.6.

5. A process for producing said sealing element according to claim 1, comprising the step of selecting time parameters during deposition of said bonding and sliding layer components to thereby set thicknesses of said first and second layer components.

6. A process according to claim 5, wherein said deposition step comprising steps of:

depositing said bonding layer component with a gas of silane; and depositing said sliding layer component with a gas mixture of silane and hydrocarbon in a ratio of about 1:1.5 to 1:5.

7. A process according to claim 6, wherein said silane to hydrocarbon gas ratio is about 1:1.2.

8. A process according to 5, comprising the steps of:

etching said sealing surface of said shut-off body with a gas of argon for about 15 to 25 min;

depositing said bonding layer component from tetramethylsilane for about 20 to 25 min in a plasma CVD coating unit; and depositing said sliding layer component from a gas mixture of tetramethylsilane and hexane in a ratio of about 1:1.5 to 1:5 for about 10 to 15 min to provide said thickness ratio of said bonding layer component to said sliding layer component being from about 1:0.9 to 1:0.4.

9. A process according to claim 8, which further comprising the step of subjecting said shut-off body to a heat treatment for 30 to 60 min at about 500° C. to maximize said adhesion capability of said bonding layer component.

10. A process according to claim 8, which further comprising the step of subjecting said shut-off body to a heat treatment for 0.5 to 1 min at about 900° C. to maximize said adhesion capability of said bonding layer component.

* * * * *